United States Patent
Sie et al.

(10) Patent No.: US 11,349,014 B2
(45) Date of Patent: May 31, 2022

(54) AIR SPACER AND METHOD OF FORMING SAME

(71) Applicant: Taiwan Semiconductor Manufacturing Co., Ltd., Hsinchu (TW)

(72) Inventors: Ming-Jhe Sie, Taipei (TW); Chen-Huang Huang, Hsinchu (TW); Shao-Hua Hsu, Taitung (TW); Cheng-Chung Chang, Kaohsiung (TW); Szu-Ping Lee, Changhua County (TW); An Chyi Wei, Hsinchu (TW); Shiang-Bau Wang, Pingzchen (TW); Chia-Jen Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/917,577

(22) Filed: Jun. 30, 2020

(65) Prior Publication Data

US 2021/0408266 A1 Dec. 30, 2021

(51) Int. Cl.
*H01L 29/66* (2006.01)
*H01L 29/78* (2006.01)
*H01L 21/8238* (2006.01)
*H01L 21/768* (2006.01)
*H01L 27/092* (2006.01)

(52) U.S. Cl.
CPC .. *H01L 29/66545* (2013.01); *H01L 21/76832* (2013.01); *H01L 21/823814* (2013.01); *H01L 21/823821* (2013.01); *H01L 21/823864* (2013.01); *H01L 21/823878* (2013.01); *H01L 27/0924* (2013.01); *H01L 29/6656* (2013.01); *H01L 29/66553* (2013.01); *H01L 29/66795* (2013.01); *H01L 29/785* (2013.01)

(58) Field of Classification Search
CPC ........... H01L 29/66545; H01L 27/0924; H01L 29/785; H01L 21/823878; H01L 21/76832; H01L 21/823814; H01L 21/823864; H01L 29/6656; H01L 29/66795; H01L 29/66553; H01L 21/823821
See application file for complete search history.

(56) References Cited

U.S. PATENT DOCUMENTS

| | | | |
|---|---|---|---|
| 10,355,100 B1 * | 7/2019 | Ueda | H01L 23/53295 |
| 2017/0084714 A1 * | 3/2017 | Ching | H01L 29/785 |
| 2017/0141215 A1 * | 5/2017 | Ching | H01L 29/6656 |
| 2019/0067442 A1 * | 2/2019 | Lin | H01L 21/764 |

* cited by examiner

*Primary Examiner* — Karen Kusumakar
*Assistant Examiner* — Adam S Bowen
(74) *Attorney, Agent, or Firm* — Slater Matsil, LLP

(57) ABSTRACT

In an embodiment, a method of forming a semiconductor device includes forming a dummy gate stack over a substrate; forming a first spacer layer over the dummy gate stack; oxidizing a surface of the first spacer layer to form a sacrificial liner; forming one or more second spacer layers over the sacrificial liner; forming a third spacer layer over the one or more second spacer layers; forming an inter-layer dielectric (ILD) layer over the third spacer layer; etching at least a portion of the one or more second spacer layers to form an air gap, the air gap being interposed between the third spacer layer and the first spacer layer; and forming a refill layer to fill an upper portion of the air gap.

20 Claims, 26 Drawing Sheets

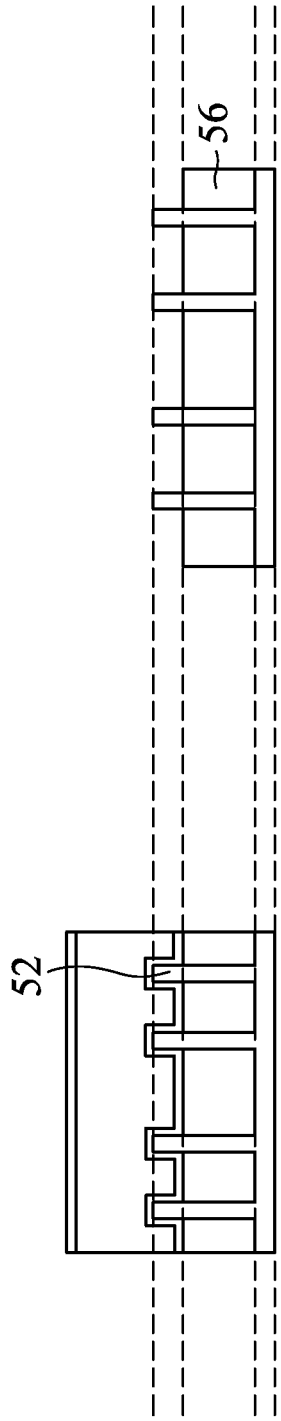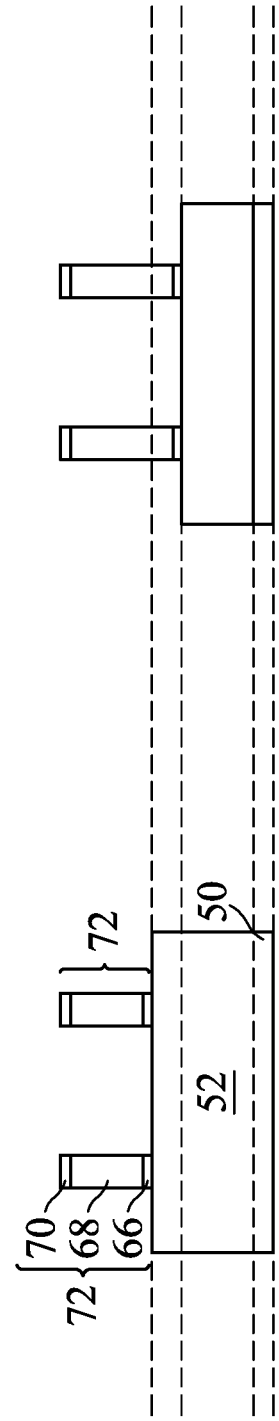

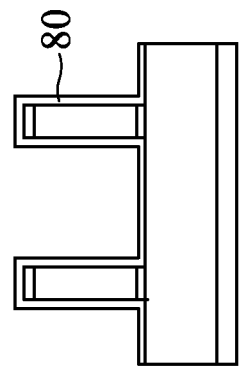
Figure 9B
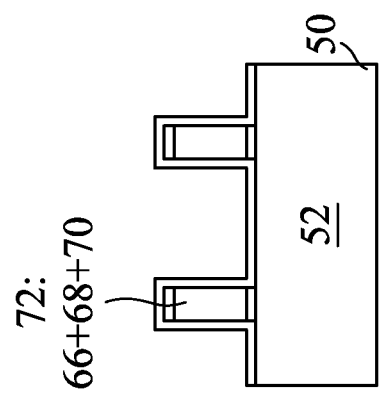
Figure 9D
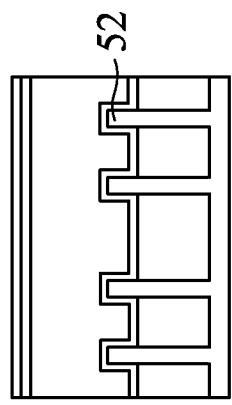
Figure 9A
Figure 9C

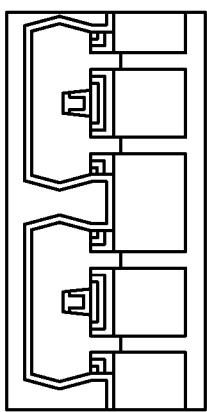
Figure 17A
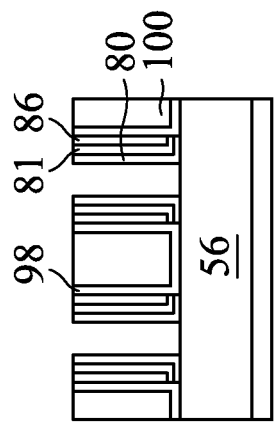
Figure 17B
Figure 17C
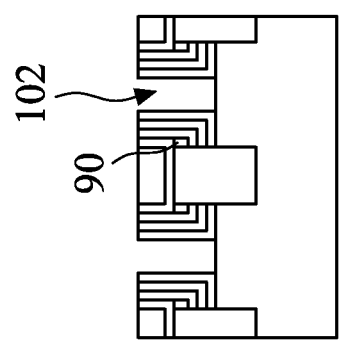
Figure 17D

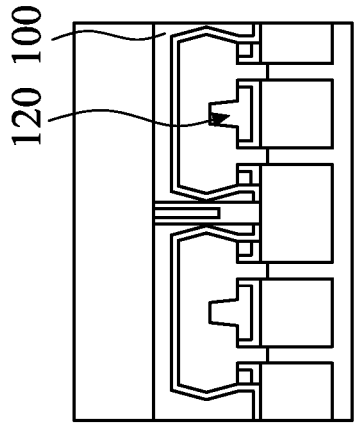
Figure 23A
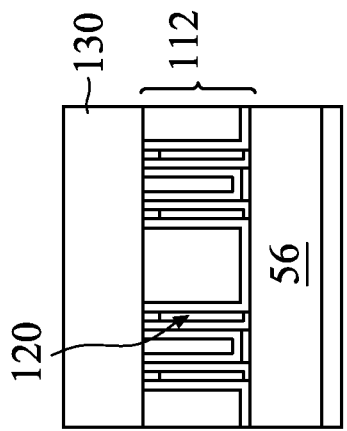
Figure 23B
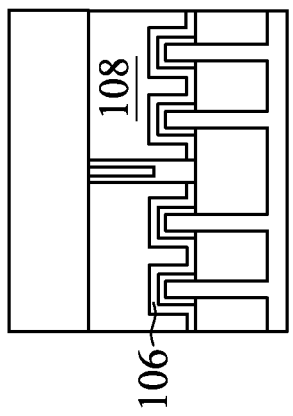
Figure 23C
Figure 23D

AIR SPACER AND METHOD OF FORMING SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 21E, 22A, 22B, 22C, 22D, 23A, 23B, 23C, 23D, 24A, 24B, 24C, 24D, and 24E are cross-sectional views of intermediate stages in the manufacturing of FinFETs, in accordance with some embodiments.

DETAILED DESCRIPTION

Figure 1:
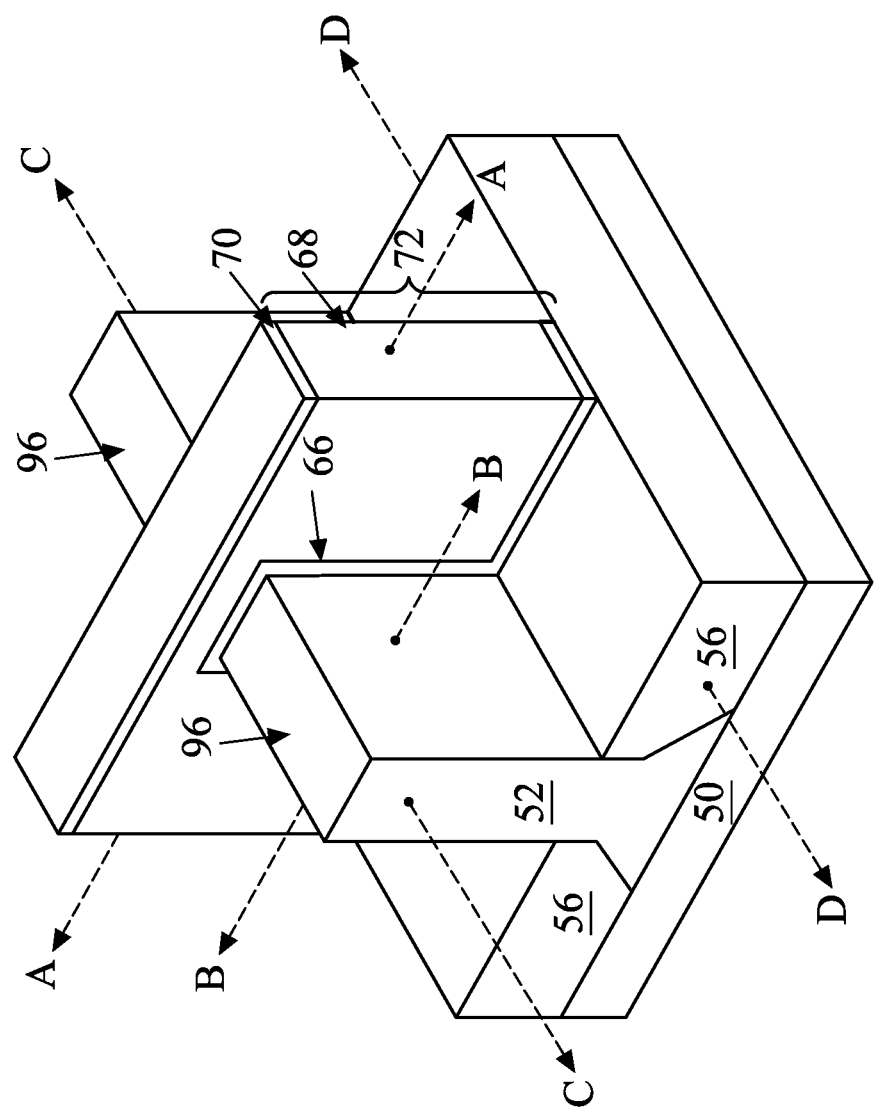
FIG. 1 illustrates an example of a Fin field-effect transistor (FinFET) in a three-dimensional view of an intermediate stage, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including integrated circuits comprising transistors, such as Fin field-effect transistor (FinFET) devices. However, embodiments are not limited to the examples provided herein, and embodiments may be implemented in a wide array of applications. As discussed in greater detail below, spacers may be formed adjacent to the gate electrode of a FinFET device to provide insulation and improve the performance of the device. The spacers may be subsequently removed, thereby replacing the spacers with air spacers or air gaps to provide better insulation than a deposited material layer.

FIG. 1 illustrates an example of an intermediate stage in the formation of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between and protruding above the neighboring isolation regions 56.

A dummy dielectric 66 is along sidewalls and over a top surface of the fin 52, and a dummy gate 68 and a mask 70 are over the dummy dielectric 66. Collectively, the dummy dielectric 66, the dummy gate 68, and the mask 70 form a dummy gate stack 72. Source/drain regions 96 are disposed in opposite sides of the fin 52 with respect to the dummy dielectric 66 and dummy gate 68. FIG. 1 further illustrates reference cross-sections that are used in later figures. Cross-section A-A is along a longitudinal axis of the dummy gate 68 and in a direction, for example, perpendicular to the direction of current flow between the source/drain regions 96 of the FinFET. Cross-section B-B is parallel to cross-section A-A and extends through a source/drain region of the FinFET. Cross-section C-C is perpendicular to cross-sections A-A and B-B and is along a longitudinal axis of the fin 52 and in a direction of, for example, a current flow between the source/drain regions 96 of the FinFET. Cross-section D-D is parallel to cross-section C-C and extends through a shallow trench isolation (STI) region and perpendicularly through the longitudinal axis of the dummy gate 68 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

Figure 24A:
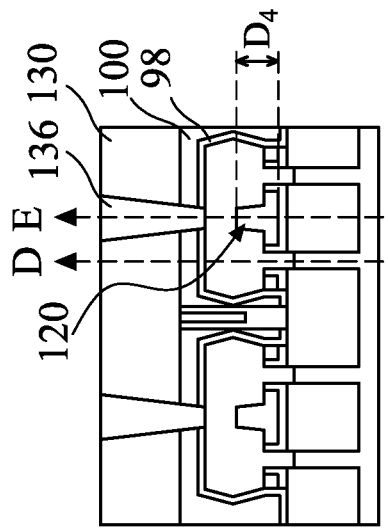
Figure 24B:
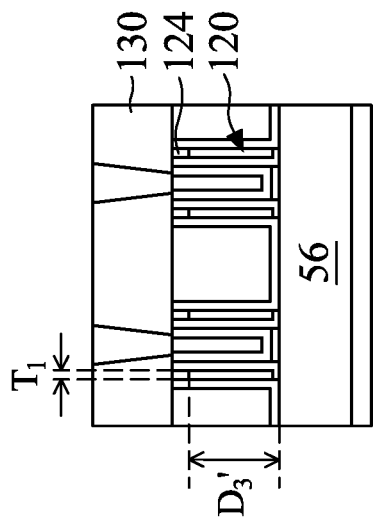

FIGS. 2 through 24D are cross-sectional views of intermediate stages in the manufacturing of FinFETs, in accordance with some embodiments. FIGS. 2 through 7 and FIGS. 8A, 9A, 10A, 11A, 12A, 13A, 14A, 15A, 16A, 17A, 18A, 19A, 20A, 21A, 22A, 23A, and 24A illustrate reference cross-section A-A illustrated in FIG. 1, except for multiple fins/FinFETs. FIGS. 8B, 9B, 10B, 11B, 12B, 13B, 14B, 15B, 16B, 17B, 18B, 19B, 20B, 21B, 22B, 23B, and 24B illustrate reference cross-section B-B illustrated in FIG. 1, except for multiple fins/FinFETs. FIGS. 8C, 9C, 10C, 11C, 12C, 13C, 14C, 15C, 16C, 17C, 18C, 19C, 20C, 21C, 22C, 23C, and 24C illustrate reference cross-section C-C illustrated in FIG. 1, except for multiple fins/FinFETs. FIGS. 8D, 9D, 10D, 11D, 12D, 13D, 14D, 15D, 16D, 17D, 18D, 19D, 20D, 21D, 22D, 23D, and 24D illustrate reference cross-section D-D illustrated in FIG. 1, except for multiple fins/FinFETs. FIGS. 21E and 24E illustrate reference cross-section E-E illustrated in FIGS. 21B and 24B, respectively.

Figure 2:
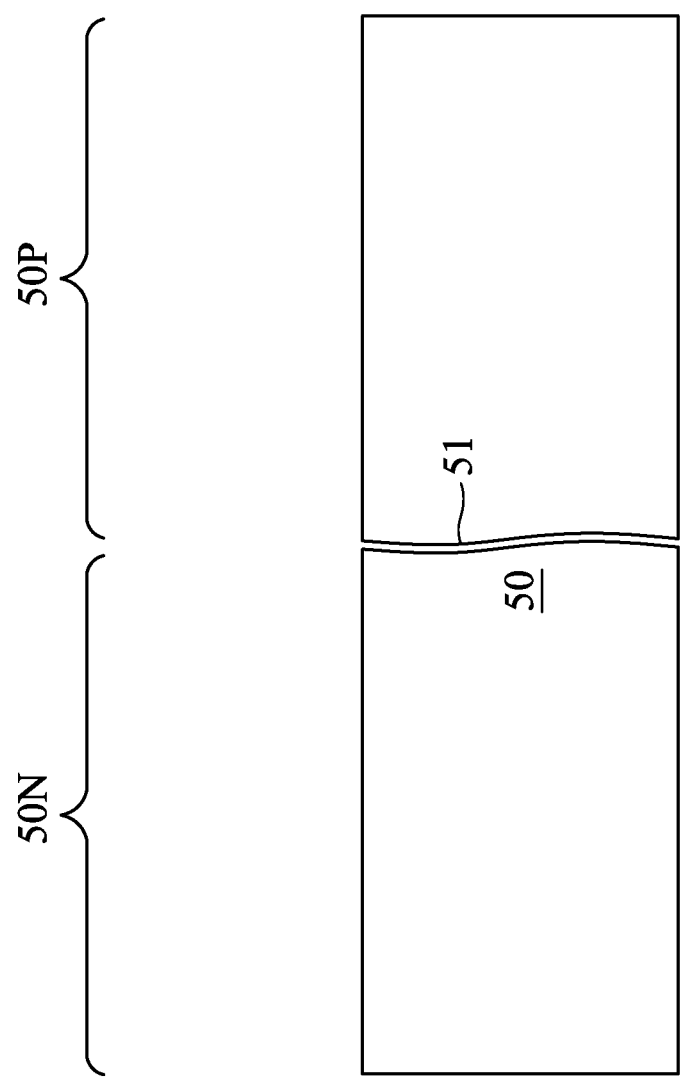

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
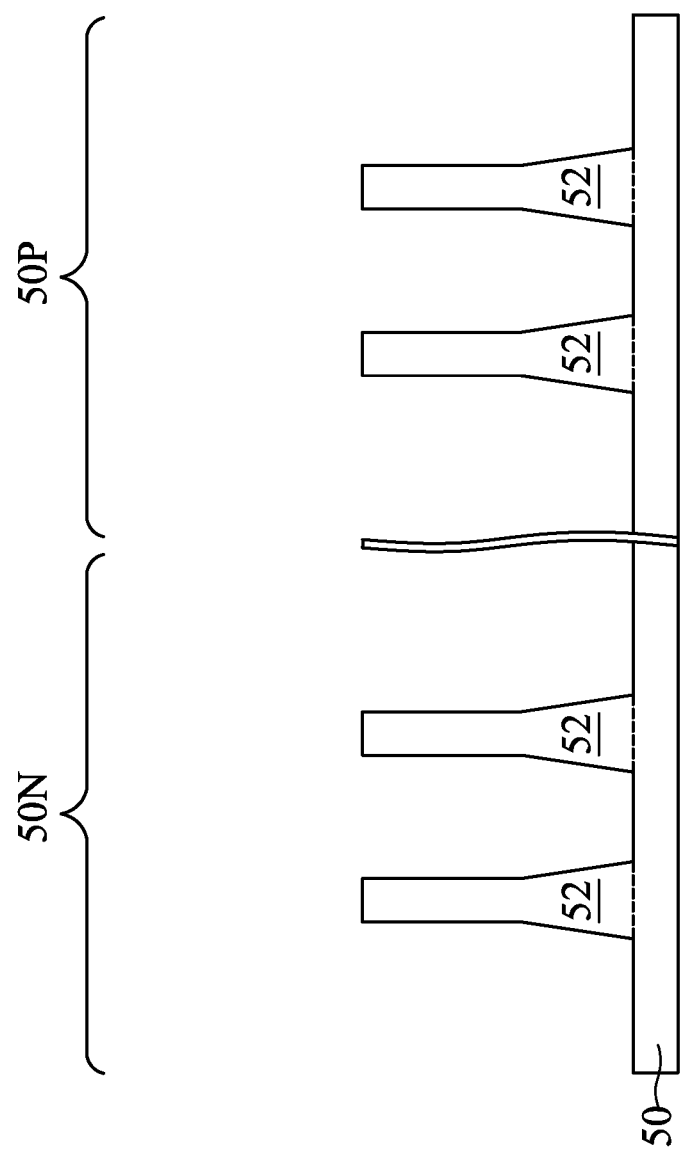

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
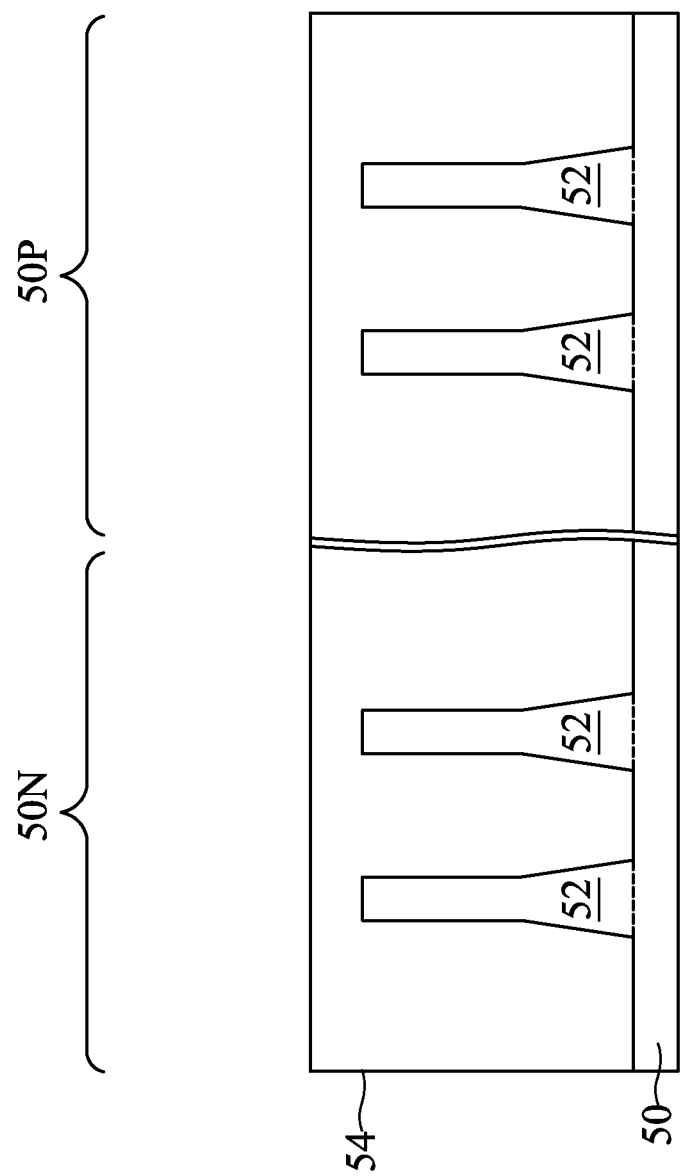

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
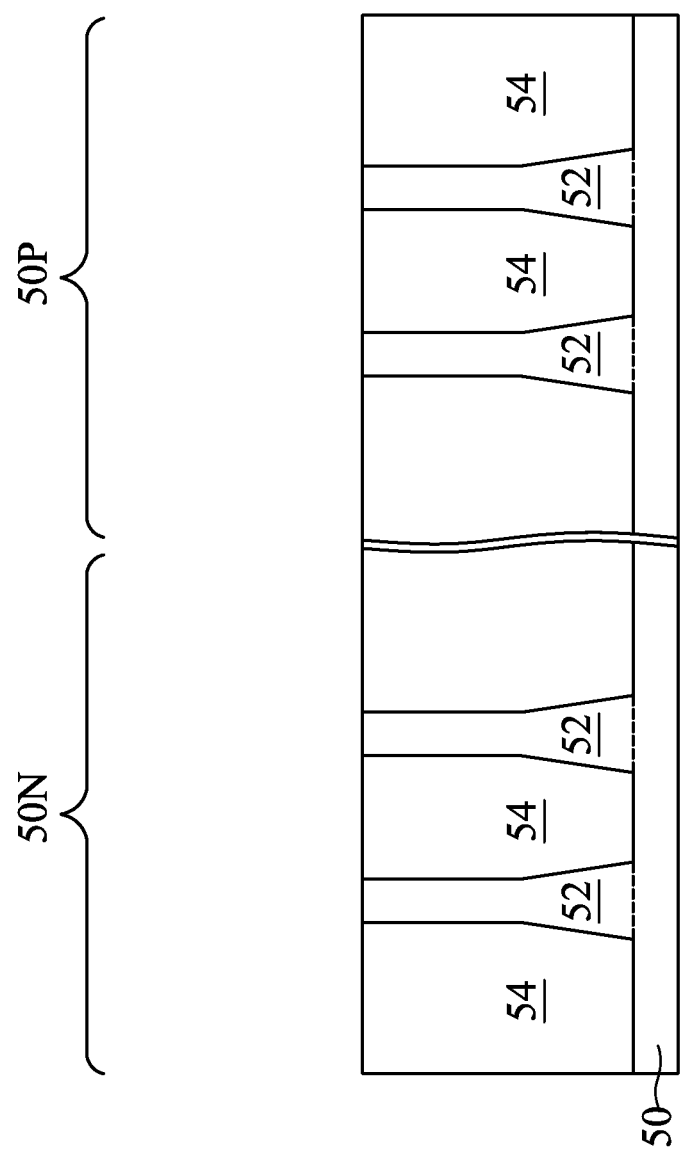

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
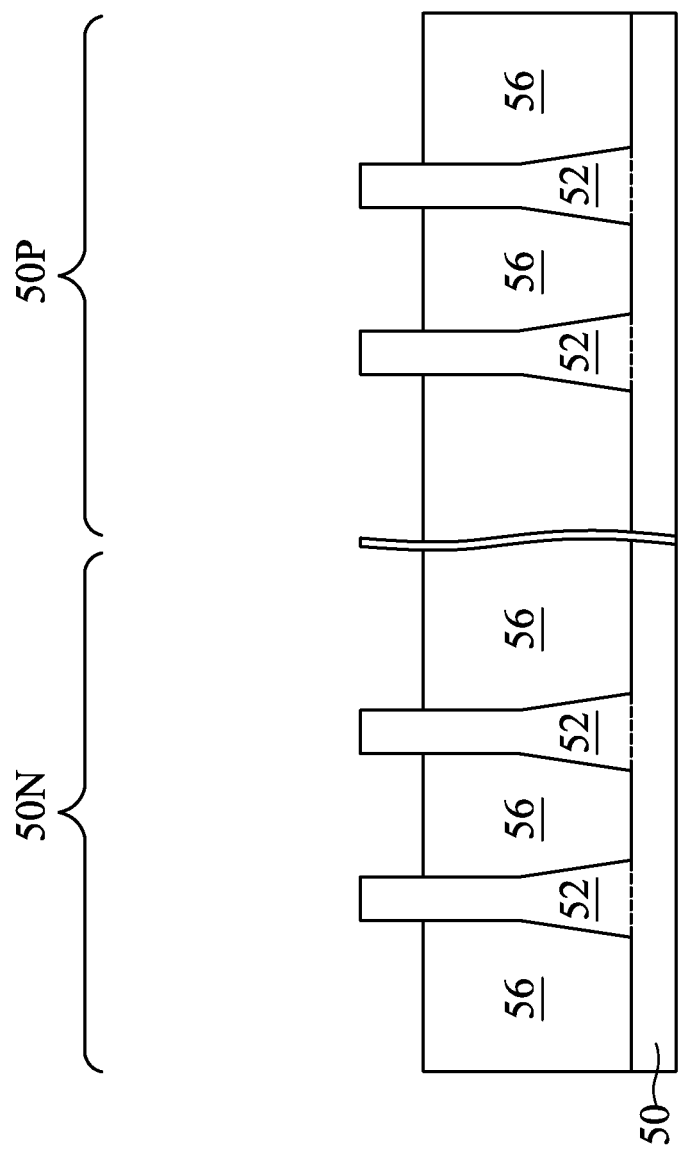

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
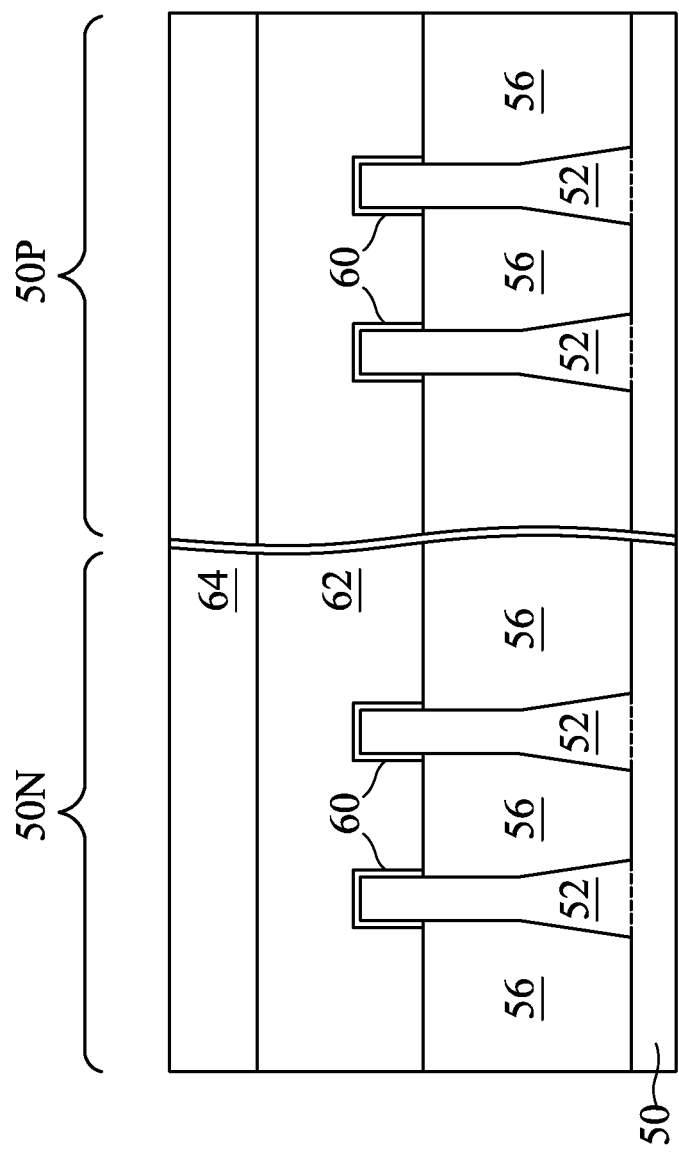
Figure 10A:
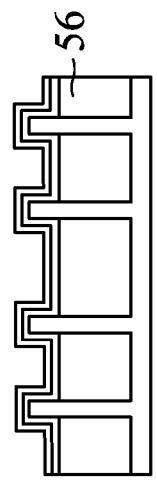
Figure 10B:
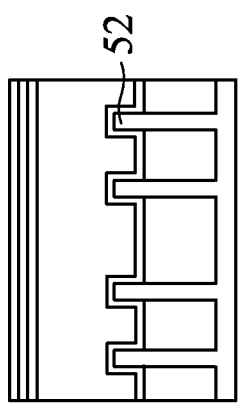
Figure 10C:
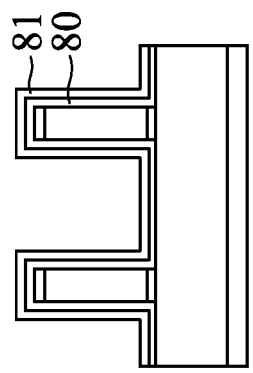
Figure 10D:
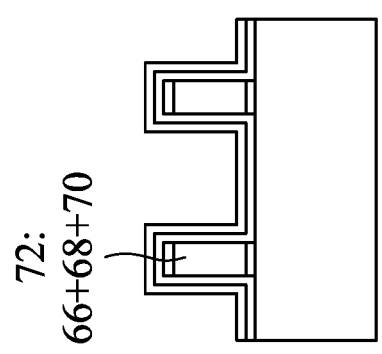
Figure 11A:
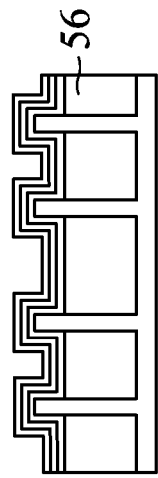
Figure 11B:
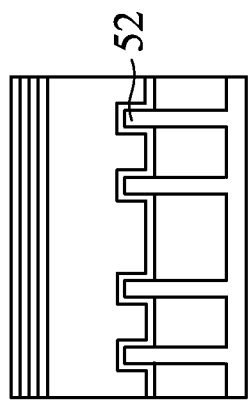
Figure 11C:
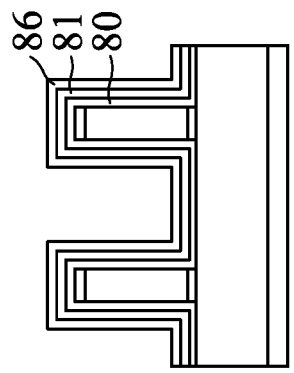
Figure 11D:
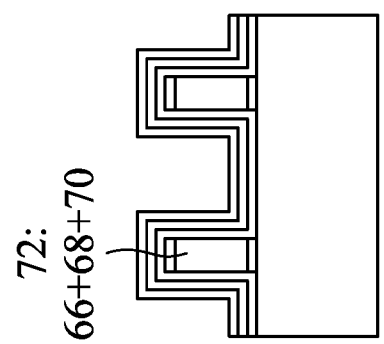
Figure 12B:
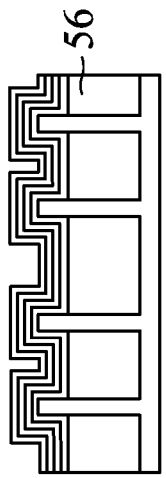
Figure 12D:
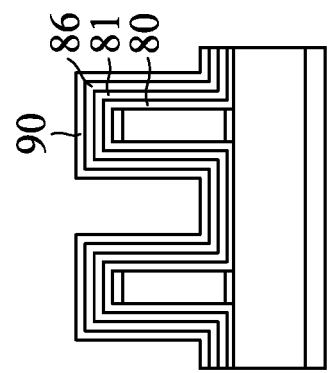
Figure 12A:
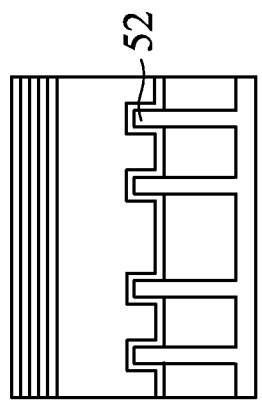
Figure 12C:
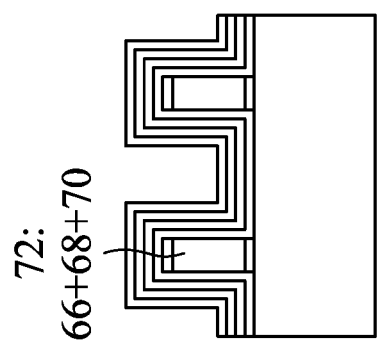

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 24D illustrate various additional steps in the manufacturing of embodiment devices. FIGS. 8A through 24D illustrate features in either of the n-type region 50N, the p-type region 50P, or both (note separately illustrated). For example, the structures illustrated in FIGS. 8A through 24D may be applicable to both the n-type region 50N and the p-type region 50P. Differences (if any) in the structures of the n-type region 50N and the p-type region 50P are described in the text accompanying each figure.

In FIGS. 8A-8D, the mask layer 64 (see FIG. 7) may be patterned using acceptable photolithography and etching techniques to form masks 70. The pattern of the masks 70 may then be transferred to the dummy gate layer 62 to form dummy gates 68. In some embodiments, the pattern of the masks 70 may also be transferred to the dummy dielectric layer 60 by an acceptable etching technique to form dummy dielectrics 66. Collectively, each dummy gate stack 72 comprises the dummy dielectric 66, the dummy gate 68, and the mask 70. The dummy gate stacks 72 cover respective channel regions of the fins 52. The pattern of the masks 70 may be used to physically separate each of the dummy gate stacks 72 from adjacent dummy gate stacks 72. The dummy gate stacks 72 may also have a lengthwise direction substantially perpendicular to the lengthwise direction of respective epitaxial fins 52.

In FIGS. 9A-9D, first spacer layer 80 is formed on exposed surfaces of the dummy gate stacks 72, STI regions 56, and/or the fins 52. A deposition may form the first spacer layer 80. The first spacer layer 80 may be formed of silicon nitride (SiN), silicon carbonitride (SiCN), silicon oxycarbonitride (SiOCN), any combinations thereof, or the like, using, for example, CVD, PVD, PECVD, ALD, the like, or any suitable process. The first spacer layer 80 may be formed to a thickness of between about 1 nm and about 10 nm.

In FIGS. 10A-10D, sacrificial liner 81 is formed on the first spacer layer 80. In some embodiments, the sacrificial liner 81 is formed by oxidizing an upper surface of the first spacer layer 80, which consequently converts the upper surface of the first spacer layer 80 to the sacrificial liner 81. The sacrificial liner 81 may be formed by CVD, PECVD, PVD, ALD the like, or any suitable process, wherein $O_2$, Ar, He, silane (Si—N—C—H), etc. precursor is flowed over the first spacer layer 80 to deposit an oxide layer and oxidize the upper surface. The precursor may be supplied at a flowrate of between about 1 slm and about 6 slm. The process may be performed at temperatures between about 200° C. and about 400° C. and at pressures between about 1 Torr and about 3 Torr. However, any suitable parameters may be utilized. The resulting sacrificial liner 81 is formed to have a high etch selectivity with the first spacer layer 80. For example, in embodiments in which the first spacer layer 80 comprises silicon nitride (SiN), silicon carbonitride (SiCN), or silicon oxycarbonitride (SiOCN), the sacrificial liner 81 may comprise silicon dioxide ($SiO_2$). Although not specifically illustrated, in some embodiments, during the process a thin layer of, for example, silicon oxide, may form over the sacrificial liner 81. In those cases, the thin layer disposed over the sacrificial liner 81 may be removed by a wet isotropic etch using hydrogen fluoride (HF), water, or a dry etch using HF, $NH_3$, the like, any combinations thereof, or any suitable etchants. Following the etch, the sacrificial liner 81 remains along an upper surface of the remaining portion of the first spacer layer 80. The sacrificial liner 81 may have a thickness of between about 2 nm and about 5 nm. In addition, after the upper surface of the first spacer layer 80 is converted, the first spacer layer 80 may have a thickness of between about 1 nm and about 10 nm.

After the formation of the first spacer layer 80 and the sacrificial liner 81, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ cm$^{-3}$ to about $10^{19}$ cm$^{-3}$. An anneal may be used to repair implant damage and to activate the implanted impurities.

In FIGS. 11A-11D, a second spacer layer 86 is formed by conformally depositing an insulating material over the sacrificial liner 81 along sidewalls of the dummy gate stacks 72. The insulating material of the second spacer layer 86 may be silicon nitride (SiN), silicon dioxide ($SiO_2$), silicon oxynitride (SiON), silicon carbonitride (SiCN), silicon oxycarbonitride (SiOCN), any combinations thereof, or the like. The second spacer layer 86 may be formed by CVD, PVD, PECVD, ALD, the like, or any suitable process. In some embodiments, the second spacer layer 86 comprises at least one of the foregoing oxygen-containing substances, such as SiOCN. The second spacer layer 86 may have a thickness in a range between about 1 nm and about 10 nm. The second spacer layer 86 is formed to have a similar etch selectivity as the sacrificial liner 81 as well as a high etch selectivity with the first spacer layer 80 and subsequently formed overlying layers. For example, in embodiments in which the first spacer layer comprises silicon nitride (SiN), silicon carbonitride (SiCN), or silicon oxycarbonitride (SiOCN) and the sacrificial liner 81 comprises silicon dioxide ($SiO_2$), the second spacer layer 86 may comprise silicon nitride (SiN), silicon dioxide ($SiO_2$), silicon oxynitride (SiON), silicon carbonitride (SiCN), or silicon oxycarbonitride (SiOCN). As discussed in detail below, the second spacer layer 86 and the sacrificial liner 81 will be selectively etched to form air spacers.

It is noted that the above disclosure generally describes a process of forming spacers and LDD regions. Other processes and sequences may be used. For example, although not specifically illustrated, fewer or additional spacers may be utilized, a different sequence of steps may be utilized (e.g., the first spacer layer 80 and the sacrificial liner 81 may be anisotropically etched prior to forming the second spacer layer 86), spacers may be formed and removed, and/or the like. Furthermore, the n-type and p-type devices may be formed using different structures and steps. For example, LDD regions for n-type devices may be formed prior to forming the second spacer layer 86 while the LDD regions for p-type devices may be formed after forming the second spacer layer 86.

FIGS. 12A-12D thru FIGS. 14A-14D illustrated formation of source/drain regions in the p-type region 50P and the n-type region 50N. Note that the process that is described may be performed first on only the p-type region 50P or the n-type region 50N at a time while the second region is masked (not specifically illustrated). Afterward, the mask is removed, and another mask (also not specifically illustrated) is formed over the first region. At which point, the process that is described may be performed on the exposed second region. Also note that various aspects of the process may be the same or different between the p-type region 50P and the n-type region 50N.

In FIGS. 12A-12D, a third spacer layer 90 is formed over the second spacer layer 86, the STI regions 56, and exposed portions of the fins 52. The third spacer layer 90 controls the spacing between the subsequently formed source/drain regions and gate electrode. A p-type third spacer layer 90 may be formed in the p-type region 50P and an n-type third spacer layer 90 may be formed in the n-type region 50N simultaneously or separately by masking each region while forming the layer in the other region. The third spacer layer 90 may be formed with the same or different materials and at the same or different thicknesses. The third spacer layer 90 may also be formed separately for semiconductor devices within the same region (e.g., the p-type region 50P or the n-type region 50N). For example, the third spacer layer 90 may comprise silicon nitride (SiN), silicon carbonitride (SiCN), silicon oxycarbonitride (SiOCN), the like, or any combinations thereof and may be formed by CVD, PVD, PECVD, ALD, the like, or any suitable process. During subsequent processing steps, oxygen may diffuse into and oxidize (or further oxidize) the third spacer layer 90. The third spacer layer 90 (e.g., silicon oxynitride) may have an etch selectivity that is the same or similar to that of the sacrificial liner 81 and/or the second spacer layer 86. In some embodiments, during subsequent steps, the third spacer layer 90 may be oxidized or chemically changed in a way to give the third spacer layer 90 an etch selectivity that is the same or closer to that of the sacrificial liner 81 and the second spacer layer 86. For example, in embodiments in which the first spacer layer 80 comprises silicon nitride (SiN), silicon carbonitride (SiCN), or silicon oxycarbonitride (SiOCN); the sacrificial liner 81 comprises silicon dioxide (SiO$_2$); and the second spacer layer 86 comprises silicon nitride (SiN), silicon dioxide (SiO$_2$), silicon oxynitride (SiON), silicon carbonitride (SiCN), or silicon oxycarbonitride (SiOCN); the third spacer layer 90 may comprise silicon nitride (SiN), silicon carbonitride (SiCN), or silicon oxycarbonitride (SiOCN).

Figure 13B:
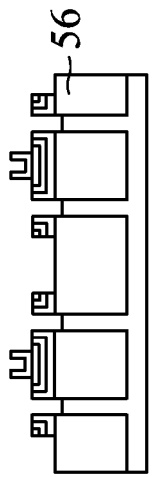
Figure 13D:
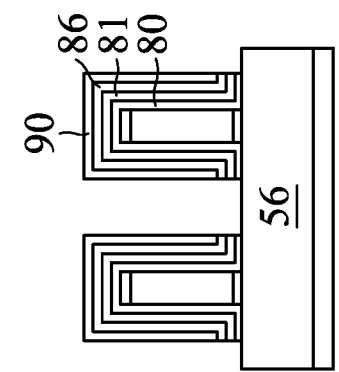
Figure 13A:
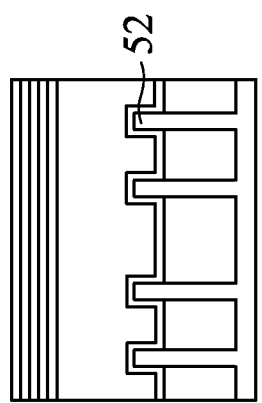
Figure 13C:
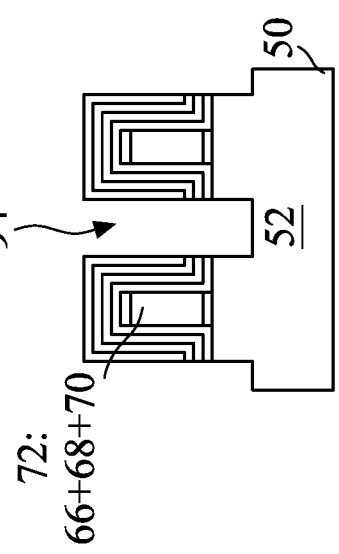

In FIGS. 13A-13D, an etching process may be performed to form recesses 94 in the fins 52 on lateral sides of the dummy gate stacks 72. The recesses 94 may be formed using anisotropic etching processes, such as reactive-ion etching (RIE), neutral beam etching (NBE), the like, or any suitable process. As illustrated in FIGS. 13B and 13C, portions of the first spacer layer 80, the sacrificial liner 81, the second spacer layer 86, and the third spacer layer 90 overlying portions of the fins 52 may be removed by the etching process. In addition, as illustrated in FIGS. 13B and 13D, other portions of the first spacer layer 80, the sacrificial liner 81, the second spacer layer 86, and the third spacer layer 90 overlying portions of the STI regions 56 may be removed by the etching process.

In FIGS. 14A-14D, epitaxial source/drain regions 96 are formed in the recesses 94 of the fins 52. The epitaxial source/drain regions 96 are formed in the fins 52 such that each dummy gate stack 72 is disposed between respective neighboring pairs of the epitaxial source/drain regions 96. In some embodiments the epitaxial source/drain regions 96 may extend into, and may also penetrate through, the fins 52. In some embodiments, the third spacer layer 90 serves to control short channel effects, threshold voltage, and other performance characteristics of the FinFET by controlling a distance between the source/drain regions 96 and subsequently formed gate electrodes. A material of the epitaxial source/drain regions 96 may be selected to exert stress in the respective channel regions, thereby improving performance.

As alluded to above, some regions of the substrate may be masked (not specifically illustrated) while one or more of the above steps (e.g., with respect to FIGS. 12A-14D) may be performed on unmasked regions. Thereafter, those masks may be removed and new masks (also not specifically illustrated) may be placed over other regions of the substrate, and one or more of the above steps may be repeated for the unmasked regions, thereby allowing different configurations and/or materials to be used for different transistors, such as p-type transistors and n-type transistors.

The epitaxial source/drain regions 96 in the p-type region 50P may include any acceptable material, such as appropriate for p-type FinFETs. For example, if the fin 52 is silicon, the epitaxial source/drain regions 96 in the p-type region 50P may comprise materials exerting a compressive strain in the channel region, such as silicon-germanium, germanium, germanium tin, or the like. The epitaxial source/drain regions 96 in the p-type region 50P may have surfaces raised from respective surfaces of the fins 52 and may have facets.

The epitaxial source/drain regions 96 in the n-type region 50N may include any acceptable material, such as appropriate for n-type FinFETs. For example, if the fin 52 is silicon, the epitaxial source/drain regions 96 in the n-type region 50N may comprise materials exerting a tensile strain in the channel region, such as silicon, silicon carbide, silicon phosphide, or the like. The epitaxial source/drain regions 96 in the n-type region 50N may have surfaces raised from respective surfaces of the fins 52 and may have facets.

The epitaxial source/drain regions 96 and/or the fins 52 may be implanted with dopants similarly to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 96 may be in situ doped during growth.

Figure 14B:
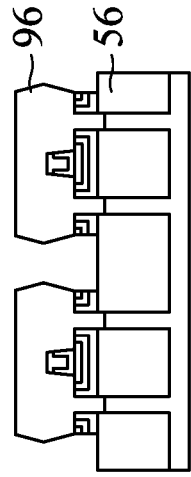

As a result of the epitaxy processes used to form the epitaxial source/drain regions 96 in the n-type region 50N and the p-type region 50P, upper surfaces of the epitaxial source/drain regions 96 have facets which expand laterally outward beyond sidewalls of the fins 52. In some embodiments, these facets cause adjacent source/drain regions 96 of a same FinFET to merge as illustrated by FIG. 14B. In other embodiments, adjacent source/drain regions 96 remain separated after the epitaxy process is completed.

Figure 14D:
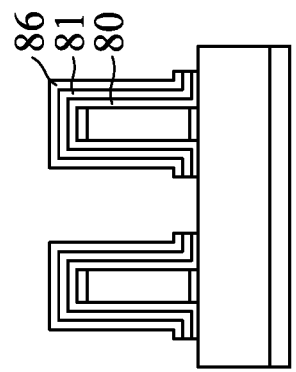
Figure 14A:
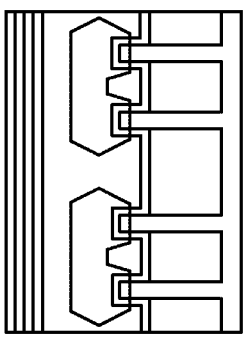
Figure 14C:
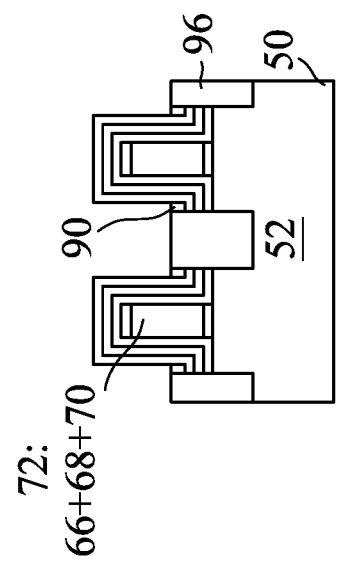
Figure 15A:
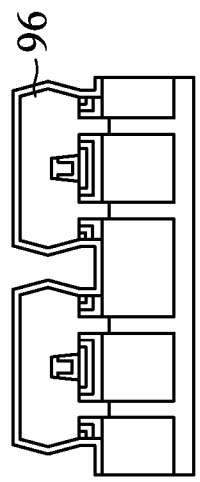
Figure 15B:
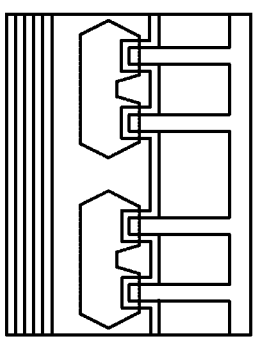
Figure 15C:
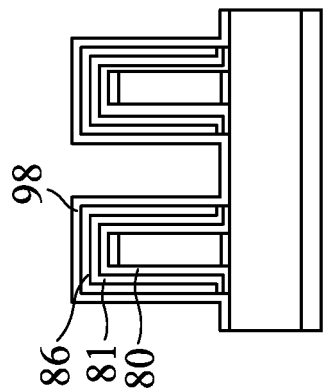
Figure 15D:
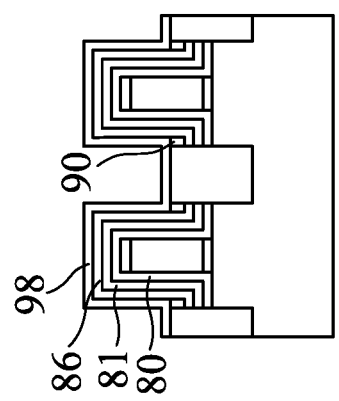
Figure 16B:
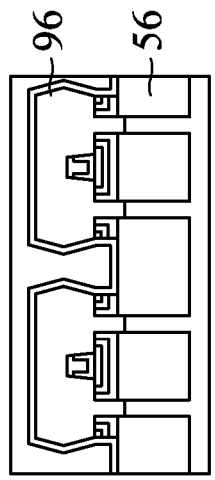
Figure 16D:
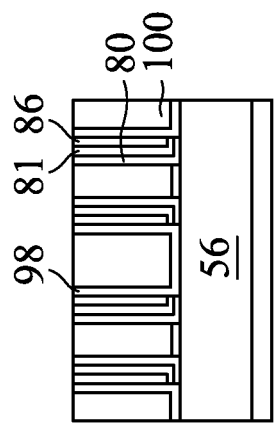
Figure 16A:
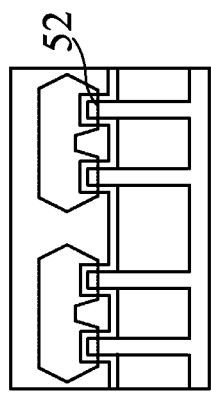
Figure 16C:
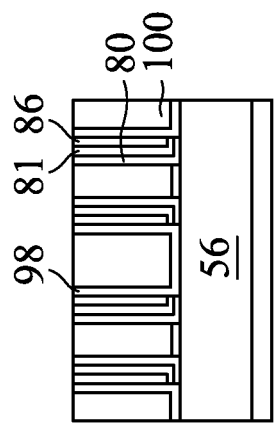
Figure 18A:
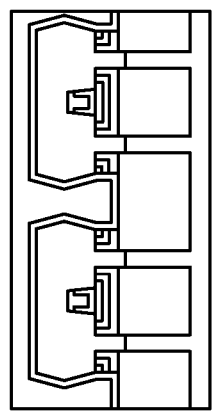
Figure 18B:
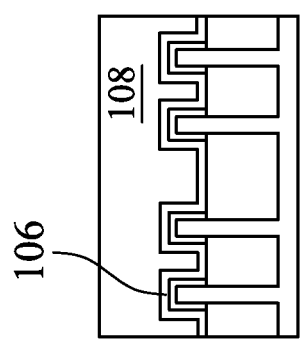
Figure 18C:
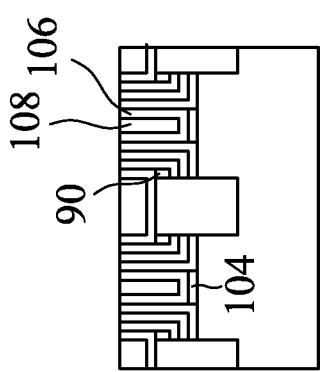
Figure 18D:
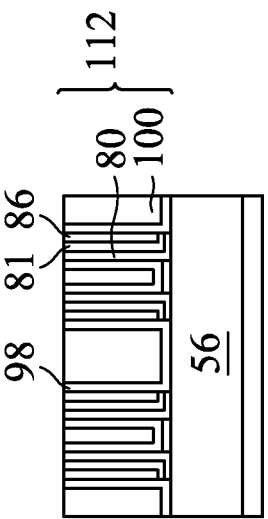
Figure 19A:
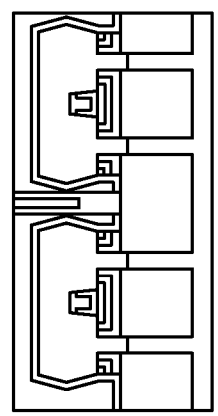
Figure 19B:
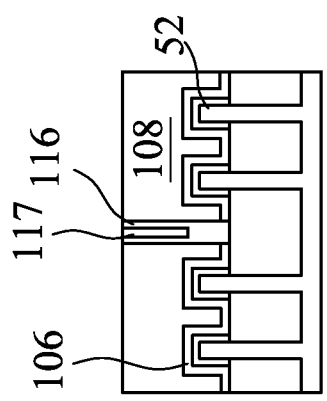
Figure 19C:
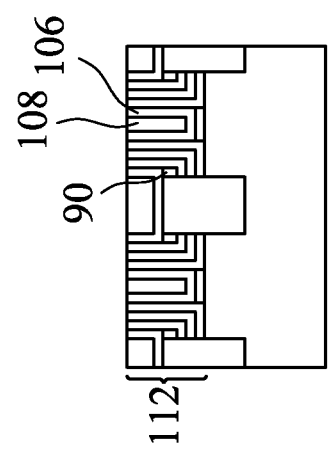
Figure 19D:
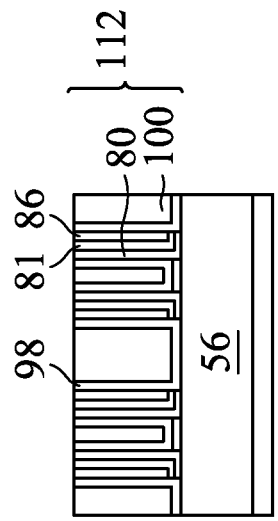
Figure 20A:
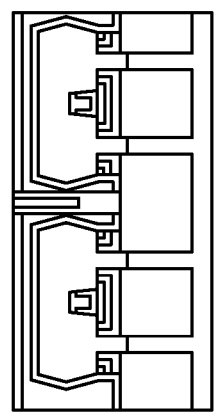
Figure 20B:
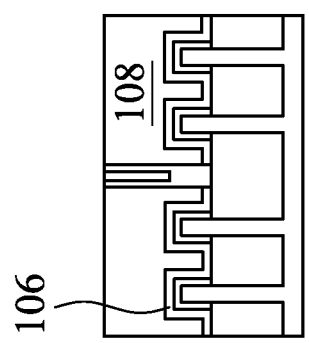
Figure 20C:
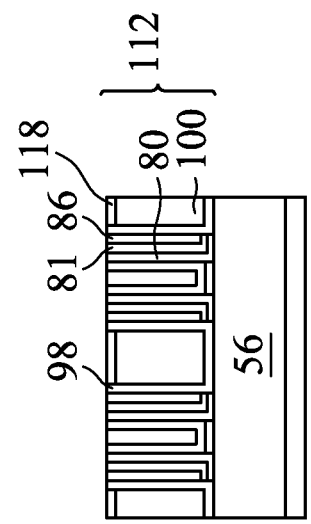
Figure 20D:
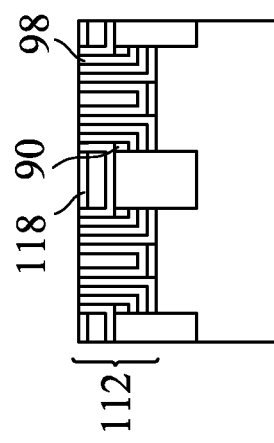

Following formation of the epitaxial source/drain regions 96, a cleaning process may be performed. In some embodiments, the cleaning process may remove exposed portions of the third spacer layer 90, such as from over and around the dummy gate stacks 72. Note that other portions of the third spacer layer 90 may remain in less exposed locations, such as portions underlying the epitaxial source/drain regions 96 as illustrated in FIG. 14B and portions sandwiched between the epitaxial source/drain regions 96 and the dummy gate stacks 72 (or, specifically, portions of the second spacer layer 86, the sacrificial liner 81, and the first spacer layer 80 extending along sidewalls of the dummy gate stack 72) as illustrated in FIG. 14D. In other embodiments, the third spacer layer 90 may not be removed during the cleaning process and may, therefore, remain in underlying the source/drain regions 96.

In FIGS. 15A-15D, a fourth spacer layer 98 is formed over the source/drain regions 96 and the dummy gate stacks 72. The fourth spacer layer 98 may serve as a contact etch stop layer, such as when forming openings for contact plugs. The fourth spacer layer 98 may be formed by conformally depositing an insulating material. The insulating material of the fourth spacer layer 98 may be silicon nitride (SiN), silicon carbonitride (SiCN), silicon oxycarbonitride (SiOCN), any combinations thereof, or the like. The fourth spacer layer 98 may be formed of a material to exhibit a high etch selectivity as compared with certain overlying layers thereby allowing an etching process to form an opening through the overlying layers to be effectively stopped.

In addition, the fourth spacer layer 98 may be formed of a material to exhibit a high etch selectivity as compared with certain underlying layers, such as the sacrificial liner 81, the second spacer layer 86, and the third spacer layer 90. As discussed in greater detail below, the sacrificial liner 81, the second spacer layer 86, and the third spacer layer 90 may be removed, thereby creating an air gap having a lower dielectric constant. As such, the first spacer layer 80 and the fourth spacer layer 98 may be formed of materials having a low etch rate as compared with the materials of the sacrificial liner 81, the second spacer layer 86, and the third spacer layer 90, thereby allowing the sacrificial liner 81, the second spacer layer 86, and the third spacer layer 90 to be removed with little or no etching of the first spacer layer 80 and the fourth spacer layer 98.

For example, in embodiments in which the first spacer layer 80 comprises silicon nitride (SiN), silicon carbonitride (SiCN), or silicon oxycarbonitride (SiOCN); the sacrificial liner 81 comprises silicon dioxide (SiO$_2$); the second spacer layer 86 comprises silicon nitride (SiN), silicon dioxide (SiO$_2$), silicon oxynitride (SiON), silicon carbonitride (SiCN), or silicon oxycarbonitride (SiOCN); the third spacer layer comprises silicon nitride (SiN), silicon carbonitride (SiCN), or silicon oxycarbonitride (SiOCN); the fourth spacer layer 98 may comprise silicon nitride (SiN), silicon carbonitride (SiCN), or silicon oxycarbonitride (SiOCN). The fourth spacer layer 98 may be formed by CVD, PVD, PECVD, ALD, the like, or any suitable process. The fourth spacer layer 98 may have a thickness of between about 1 nm and about 10 nm.

In FIGS. 16A-16D, a first interlayer dielectric (ILD) 100 is deposited over the dummy gate stacks 72, the STI regions 56, and the source/drain regions 96. The first ILD 100 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Further, a planarization process, such as a CMP, may be performed to level the top surface of the first ILD 100 with the top surfaces of the dummy gate stacks 72. The planarization process may remove the masks 70 on the dummy gates 68, and portions of the first spacer layer 80, the sacrificial liner 81, the second spacer layer 86, and the fourth spacer layer 98 that may be along sidewalls of the masks 70 (as well as the third spacer layer 90 if portions remain over and around the dummy gate stacks 72). After the planarization process, top surfaces of the dummy gates 68, the first spacer layer 80, the sacrificial liner 81, the second spacer layer 86, and the fourth spacer layer 98 are level. Accordingly, the top surfaces of the dummy gates 68 are exposed through the first ILD 100. In some embodiments not specifically illustrated, the masks 70 may remain, in which case the planarization process levels the top surface of the first ILD 100 with the masks 70.

In FIGS. 17A-17D, the dummy gates 68, and the masks 70 if present, are removed in an etching step(s), so that recesses 102 are formed. Portions of the dummy dielectrics 66 in the recesses 102 may also be removed as illustrated in FIGS. 17A-17D. In some embodiments, only the dummy gates 68 are removed and the dummy dielectrics 66 remain and are exposed by the recesses 102. In some embodiments, the dummy dielectrics 66 are removed from recesses 102 in a first region of a die (e.g., a core logic region) and remain in recesses 102 in a second region of the die (e.g., an input/output region). In some embodiments, the dummy gates 68 are removed by an anisotropic dry etch process. For example, the etching process may include a dry etch process using reaction gas(es) that selectively etch the dummy gates 68 with little or no etching of the first ILD 100 or the first spacer layer 80, the sacrificial liner 81, the second spacer layer 86, and the fourth spacer layer 98. Each recess 102 exposes and/or overlies a channel region of a respective fin 52. Each channel region is disposed between neighboring pairs of the epitaxial source/drain regions 96. During the removal, the dummy dielectrics 66 may be used as etch stop layers when the dummy gates 68 are etched. The dummy dielectrics 66 may then be optionally removed after the removal of the dummy gates 68 by a suitable etching process.

In FIGS. 18A-18D, gate dielectric layers 106 and gate electrodes 108 are formed for replacement gates 112. Gate dielectric layers 106 may comprise one or more layers deposited in the recesses 102, such as on the top surfaces and the sidewalls of the fins 52 and on sidewalls of the first spacer layer 80. The gate dielectric layers 106 may also be formed on the top surface of the first ILD 100. In some embodiments, the gate dielectric layers 106 comprise one or more dielectric layers, such as one or more layers of silicon oxide, silicon nitride, metal oxide, metal silicate, or the like. For example, in some embodiments, the gate dielectric layers 106 include an interfacial layer 104 (separately illustrated) of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 106 may include a dielectric layer having a k value greater than about 7.0. The formation methods of the gate dielectric layers 106 may include Molecular-Beam Deposition (MBD), ALD, PECVD, and the like. In embodiments where portions of the dummy dielectrics 66 remain in the recesses 102, the gate dielectric layers 106 (such as the interfacial oxide layer 104) include a material of the dummy dielectrics 66 (e.g., SiO$_2$).

The gate electrodes 108 are deposited over the gate dielectric layers 106, respectively, and fill the remaining portions of the recesses 102. The gate electrodes 108 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 108 is illustrated, the gate electrode 108 may comprise any number of liner layers, any number of work function tuning layers, and a fill material (none of which specifically illustrated). After the filling of the recesses 102, a planarization process, such as a CMP, may be performed to remove the excess portions of the gate dielectric layers 106 and the material of the gate electrodes 108, which excess portions are over the top surface of the first ILD 100. The remaining portions of material of the gate electrodes 108 and the gate dielectric layers 106 thus form replacement gates 112 of the resulting FinFETs. The gate electrodes 108 and the gate dielectric layers 106 may be collectively referred to as a "gate stack." The gate stacks may further extend along sidewalls of a channel region of the fins 52.

The formation of the gate dielectric layers 106 in the n-type region 50N and the p-type region 50P may occur simultaneously such that the gate dielectric layers 106 in each region are formed from the same materials, and the formation of the gate electrodes 108 may occur simultaneously such that the gate electrodes 108 in each region are formed from the same materials. In some embodiments, the gate dielectric layers 106 in each region may be formed by distinct processes, such that the gate dielectric layers 106 may be different materials/thicknesses, and/or the gate electrodes 108 in each region may be formed by distinct processes, such that the gate electrodes 108 may be different materials/thicknesses. Various masking steps may be used to mask and expose appropriate regions when using distinct processes.

In FIGS. 19A-19D, the gate electrodes 108 may be cut to form distinct gate electrodes 108 for different fins 52 or groups of fins 52. For example, portions of the gate electrodes 108 may be masked, and the exposed regions may be etched, such as anisotropically etched. A first refill layer 116 may then be formed in the cut regions. The first refill layer 116 may comprise one or more layers of dielectric material, including silicon nitride (SiN), the like, or any combinations thereof. During deposition of the first refill layer 116, an upper region may get pinched off and form a seam 117 as illustrated.

In FIGS. 20A-20D, the first ILD layer 100 is recessed, and a capping layer 118 is formed over the first ILD layer 100 and the gate electrodes 108. The capping layer 118 serves to protect the first ILD layer 100 during subsequent etching steps. For example, as discussed in greater detail below, the capping layer 118 protects the first ILD layer 100 while etching the sacrificial liner 81, the second spacer layer 86, and the third spacer layer 90. As such, it may be desirable to select a material for the capping layer 118 that exhibits a low etch rate as compared to the etch rate of the sacrificial liner 81, the second spacer layer 86, and the third spacer layer 90, thereby allowing removal of the sacrificial liner 81, the second spacer layer 86, and the third spacer layer 90 with little or no etching of the capping layer 118. For example, in embodiments in which the first spacer layer 80 comprises silicon nitride (SiN), silicon carbonitride (SiCN), or silicon oxycarbonitride (SiOCN); the sacrificial liner 81 comprises silicon dioxide (SiO$_2$); the second spacer layer 86 comprises silicon nitride (SiN), silicon dioxide (SiO$_2$), silicon oxynitride (SiON), silicon carbonitride (SiCN), or silicon oxycarbonitride (SiOCN); the third spacer layer 90 comprises silicon nitride (SiN), silicon carbonitride (SiCN), or silicon oxycarbonitride (SiOCN); the fourth spacer layer comprises silicon nitride (SiN), silicon carbonitride (SiCN), or silicon oxycarbonitride (SiOCN); the capping layer 118 may comprise silicon oxycarbide (SiOC), silicon carbonitride (SiCN), or silicon nitride (SiN). The capping layer 118 may be formed by CVD, PVD, ALD, PECVD, the like, or any suitable process. A planarization process (e.g., CMP) is performed to remove portions of the capping layer 118 over the gate electrodes 108.

Figure 21A:
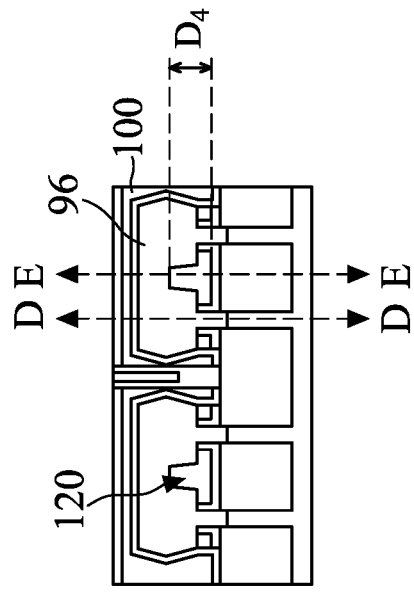
Figure 21B:
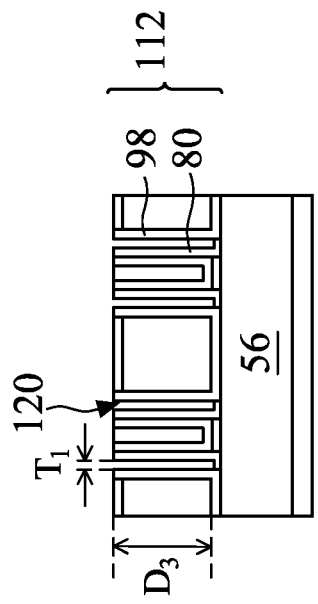
Figure 21C:
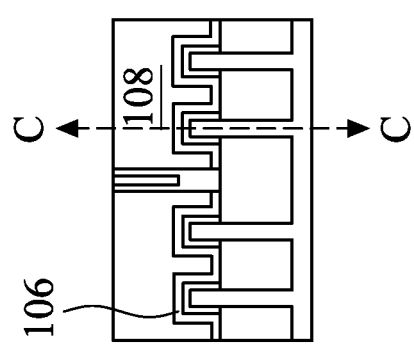
Figure 21D:
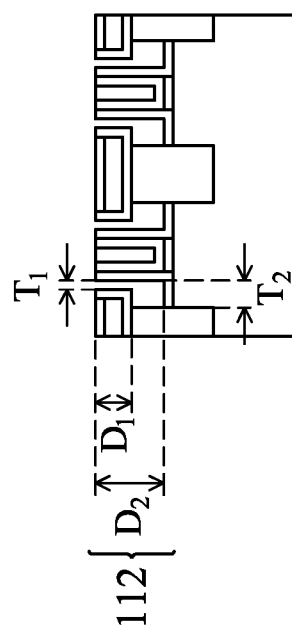
Figure 21E:
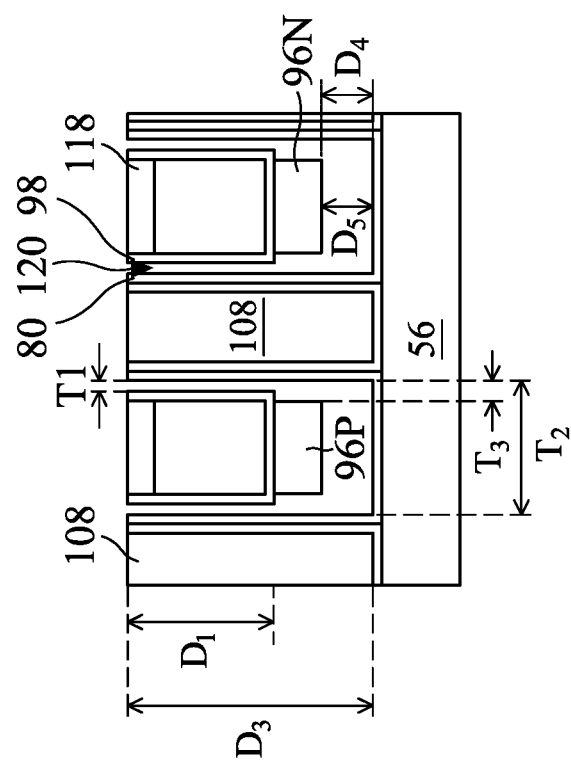
Figure 22B:
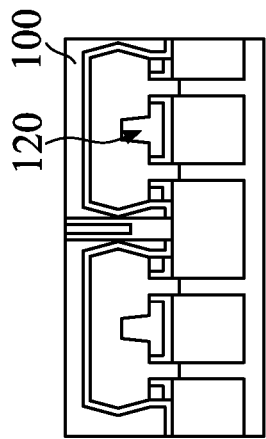
Figure 22D:
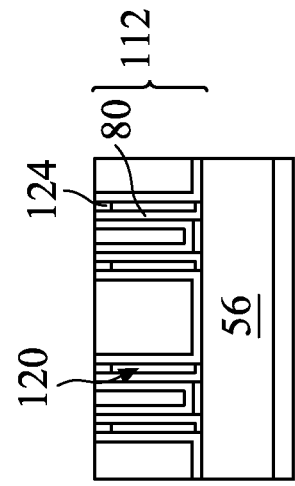
Figure 22A:
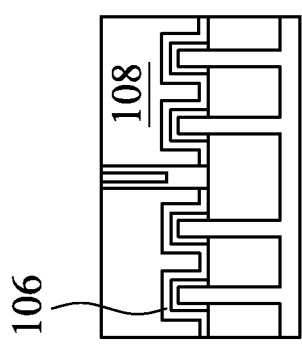
Figure 22C:
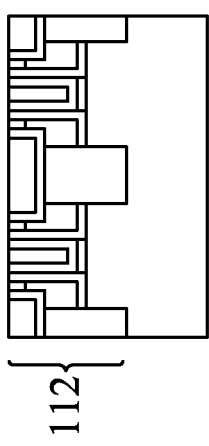

In FIGS. 21A-21E, air spacers (or air gaps) 120 are formed by etching the second spacer layer 86 and the sacrificial liner 81. In addition, portions or all of the third spacer layer 90 may also be etched. The figures illustrate a complete etching of entireties of the sacrificial liner 81, the second spacer layer 86, and the third spacer layer 90. However, as described in greater detail below, in accordance with some embodiments, the etching may be stopped before reaching full completion (not specifically illustrated). As a reminder, FIG. 21C illustrates the C-C cross-section from FIG. 1 and also labeled in FIG. 21A. Additionally, FIG. 21D illustrates the D-D cross-section from FIG. 1 and also labeled in FIG. 21B. Further, FIG. 21E illustrates an E-E cross-section, which is not labeled in FIG. 1 but is labeled in FIG. 21B. Referring briefly to FIG. 21E, although the epitaxial source/drain region 96 is illustrated as having a lower edge being substantially flat and parallel to upper surfaces of the STI regions 56 and/or the first spacer layer 80, the lower edge of the epitaxial source/drain region 96 may instead have a convex U-shape such that a central portion is more proximal than an outer portion to the underlying STI region 56.

The etch to form the air spacers 120 may be an isotropic etch and may comprise any suitable wet or dry etchant. For example, in embodiments in which the first spacer layer 80 comprises silicon nitride (SiN), silicon carbonitride (SiCN), silicon oxycarbonitride (SiOCN); the sacrificial liner 81 comprises silicon dioxide (SiO$_2$); the second spacer layer 86 comprises silicon nitride (SiN), silicon dioxide (SiO$_2$), silicon oxynitride (SiON), silicon carbonitride (SiCN), or silicon oxycarbonitride (SiOCN); the third spacer layer 90 comprises silicon nitride (SiN), silicon carbonitride (SiCN), or silicon oxycarbonitride (SiOCN); the fourth spacer layer 98 comprises silicon nitride (SiN), silicon carbonitride (SiCN), or silicon oxycarbonitride (SiOCN); and the capping layer 118 comprises silicon oxycarbide (SiOC), silicon carbonitride (SiCN), or silicon nitride (SiN); a dry etch process using HF, $H_2O_{(g)}$ may be used to selectively etch the sacrificial liner 81, the second spacer layer 86, and the third spacer layer 90, with little or no etching of first spacer layer 80, the fourth spacer layer 98, and the capping layer 118. Consequently, the first spacer layer 80 and the fourth spacer layer 98 remain after the wet etch. Although not specifically illustrated, portions of one or more of the gate dielectric layers 106 (e.g., oxides such as hafnium oxide) may be etched during such a wet etch process.

As illustrated, the air spacers 120 may extend along the first spacer layer 80 adjacent to the replacement gates 112 as well as under and between source/drain regions 96. As illustrated in FIGS. 21C-21E, portions of the air spacers 120 at various depths $D_1$, $D_2$, and $D_3$ (measured from an upper surface of the first spacer layer 80) in each cross-section may have thicknesses $T_1$, $T_2$, and $T_3$ (measured in lateral directions). For example, depth $D_1$ may be between about 15 nm and about 50 nm, depth $D_2$ may be between about 20 nm and about 60 nm, and depth $D_3$ may be between about 60 nm and about 120 nm. In addition, thickness $T_1$ may be between about 1 nm and about 4 nm, thickness $T_2$ may be between about 2 nm and about 8 nm, and thickness $T_3$ may be between about 15 nm and about 30 nm. As illustrated in FIG. 21B, the air spacers may have a depth $D_4$ (measured from below outer portions of the epitaxial source/drain regions 96 to the first spacer layer 80), the depth $D_4$ being between about 10 nm and about 40 nm. As illustrated in FIG. 21E and as described above, a lower edge of the epitaxial source/drain region 96 may be substantially flat or have a convex U-shape, such that the air spacers 120 may also have a depth $D_5$ (measured from below central portions of the epitaxial source/drain regions 96 to the first spacer layer 80), the depth $D_5$ being between about 5 nm and about 40 nm.

In some embodiments, the FinFET devices in the n-type region 50N and in the p-type region 50P are etched at the same time. The combination of the second spacer layer 86 and the sacrificial liner 81 provide a greater total thickness and composition for etching than if only the second spacer layer 86 were being etched. The greater total thickness and composition benefits the process of forming the air spacers 120 in multiple ways. The second spacer layer 86 may be formed to a lesser thickness, which reduces the effects that the second spacer layer 86 may have on neighboring or nearby layers during subsequent processing steps. For example, the greater total thickness and composition increases the etch rate and yield in both regions (e.g., the n-type region 50N and the p-type region 50P) by providing more space for the etchant to reach lower portions of the second spacer layer 86 and the sacrificial liner 81 along the first spacer layer 80 and the replacement gates 112. For example, the etch rate of the second spacer layer 86 and the sacrificial liner 81 may be between about 100% and about 200% faster than the etch rate would be for only the second spacer layer 86.

In addition, although the second spacer layer 86 and the sacrificial liner 81 may not etch at the exact same rate in the p-type region 50P as compared to the n-type region due to differences in thicknesses and compositions of some layers as well as other treatment processes, the greater total thickness and corresponding increased etch rates reduce the disparity. As discussed above, the second spacer layer 86 in the p-type region 50P may be doped with boron, while the second spacer layer 86 in the n-type region 50N may be doped with phosphorous. The etchants (e.g., hydrogen fluoride and water) may more efficiently etch the phosphorous-doped regions of the second spacer layer 86 as compared to the boron-doped regions of the second spacer layer 86. Due to one or more of these differences between the regions, the etch rate to form the air spacers 120 in the p-type region 50P may be some degree slower than the etch rate to form the air spacers 120 in the n-type region 50N. However, the greater total thickness for etching reduces the differences between the etch rates between the p-type region 50P and the n-type region 50N—that is, an N-P loading. For example, when the air spacer 120 in the p-type region 50P reaches a depth of about 65 nm, the air spacer 120 in the n-type region 50N may have etched about 17 nm further. In addition, when the air spacer 120 in the p-type region 50P reaches a depth of about 88 nm (or almost the full height of the replacement gate 112, such as to the first spacer layer 80), the air spacer 120 in the n-type region 50N may have etched about 1 nm further.

Further, the increased etch rates in forming the air spacers 120 reduce unwanted etching of other exposed features, such as the gate dielectric layers 106 and/or the gate electrodes 108. For example, as alluded to above, one or more of the gate dielectric layers 106 (e.g., a high-k dielectric layer) may lose about 5% less, or up to about 10% less, when etching the second spacer layer 86 and the sacrificial liner 81 as compared to what may be lost from the one or more gate dielectric layers 106 if etching only the second spacer layer 86 as a result of less etching time.

In FIGS. 22A-22D, a second refill layer 124 is deposited over the gate electrodes 108, over the capping layer 118, and into the upper portions of the air spacers 120. As illustrated, the second refill layer 124 accumulates in the upper portions of the air spacers 120 without depositing throughout other portions of the air spacers 120. The second refill layer 124 may comprise silicon nitride (SiN), silicon carbonitride (SiCN), silicon oxycarbonitride (SiOCN) the like, or any combinations thereof. The second refill layer 124 may be formed by CVD, PVD, ALD, PECVD, the like, or any suitable process. Following the deposition of the second refill layer 124, a planarization process, such as CMP, may be performed to remove excess portions of the second refill layer 124 as well as the capping layer 118. Portions of the second refill layer 124 remain within the upper portions of the air spacers 120 and serve to cap the air spacers 120 to prevent or reduce other non-gaseous materials from getting into the air spacers 120 during subsequent processing steps. The second refill layer 124 may have a thickness in a range between about 5 nm and about 20 nm.

Although not specifically illustrated, a gate mask may be formed over the replacement gate 112 (e.g., the gate dielectric layers 106 and the gate electrode 108), and the gate mask may be disposed between opposing portions of the first spacer layer 80. In some embodiments, forming the gate mask includes recessing the replacement gate so that a recess is formed directly over the replacement gate 112 and between opposing portions of the first spacer layer 80. A gate mask comprising one or more layers of dielectric material, such as silicon nitride, silicon oxynitride, or the like, is filled in the recess, followed by a planarization process to remove excess portions of the dielectric material extending over the first ILD 100.

In FIGS. 23A-23D, a second ILD 130 is deposited over the first ILD 100. In some embodiments, the second ILD 130 is a flowable film formed by a flowable CVD method. In some embodiments, the second ILD 130 is formed of a dielectric material such as PSG, BSG, BPSG, USG, or the like, and may be deposited by any suitable method, such as CVD and PECVD. The subsequently formed gate contacts 134 (FIGS. 24A-24E) penetrate through the second ILD 130 to contact the top surface of the gate electrode 108. In some embodiments, a contact etch stop layer (CESL) (not specifically illustrated) is disposed between the second ILD 130 and the replacement gates 112 and the first ILD 100. The CESL may comprise a dielectric material, such as, silicon nitride, silicon oxide, silicon oxynitride, or the like, having a lower etch rate than the material of the overlying second ILD 130.

Figure 24C:
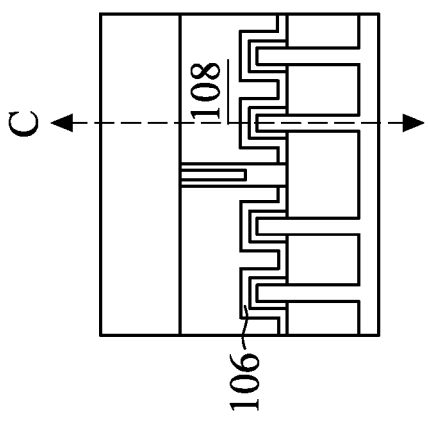
Figure 24D:
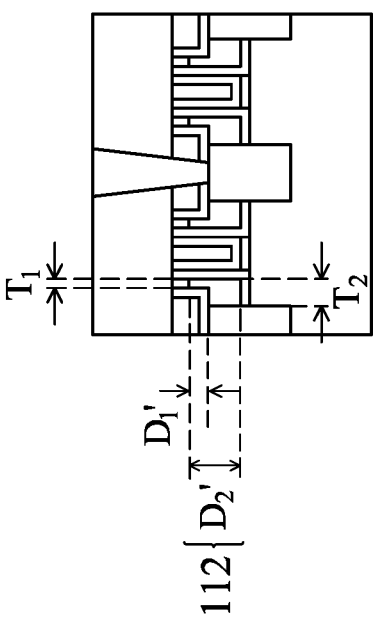
Figure 24E:
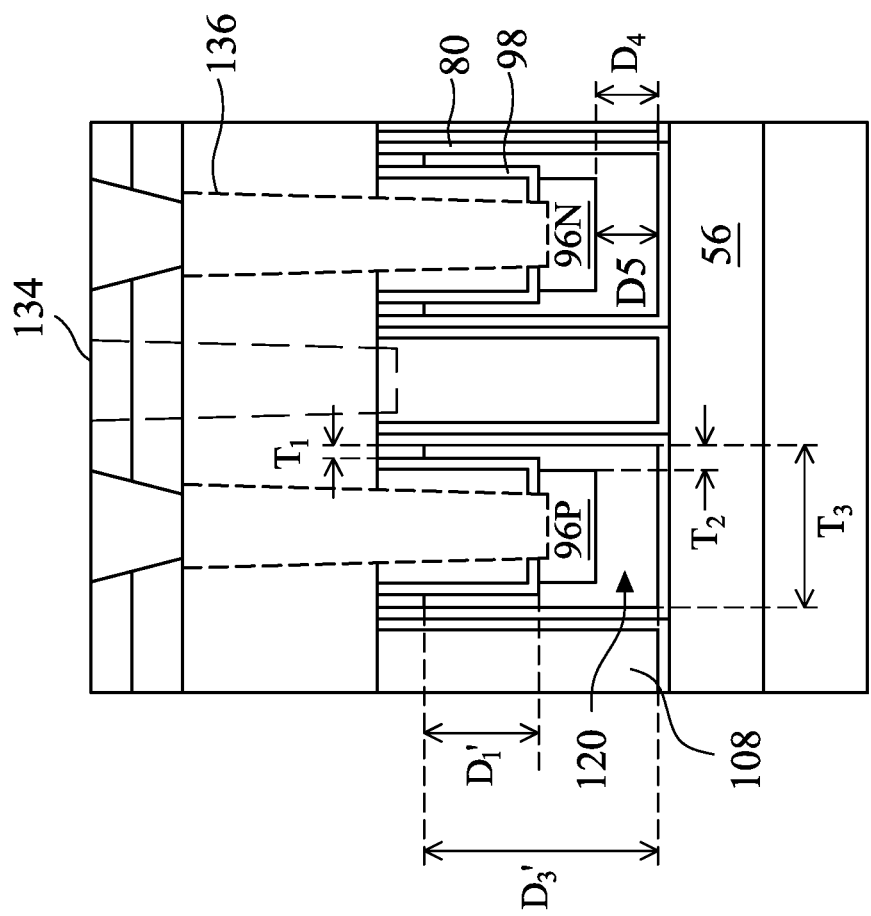

In FIGS. 24A-24E, gate contacts 134 are formed through the second ILD 130, and source/drain contacts 136 are formed through the second ILD 130 and the first ILD 100, in accordance with some embodiments. As discussed above, the figures illustrate a complete etching of entireties of the sacrificial liner 81, the second spacer layer 86, and the third spacer layer 90. However, in accordance with some embodiments, the etching may have been stopped before reaching full completion (not specifically illustrated). FIG. 24C illustrates the C-C cross-section from FIG. 1 and also labeled in FIG. 24A. Additionally, FIG. 24D illustrates the D-D cross-section from FIG. 1 and also labeled in FIG. 24B. Further, FIG. 24E illustrates the E-E cross-section, which is not labeled in FIG. 1 but is labeled in FIG. 24B.

Openings for the source/drain contacts 136 are formed through the first and second ILDs 100 and 130, respectively, and the fourth spacer layer 98. Openings for the gate contact 134 are formed through the second ILD 130. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 130. The remaining liner and conductive material form the source/drain contacts 136 and gate contacts 134 in the openings. An anneal process may be performed to form a silicide at the interface between the epitaxial source/drain regions 96 and the source/drain contacts 136. The source/drain contacts 136 are physically and electrically coupled to the epitaxial source/drain regions 96, and the gate contacts 134 are physically and electrically coupled to the gate electrodes 108. The source/drain contacts 136 and gate contacts 134 may be formed in different processes, or may be formed in the same process. Although shown as being formed in the same cross-sections, it should be appreciated that each of the source/drain contacts 136 and gate contacts 134 may be formed in different cross-sections, which may avoid shorting of the contacts.

As illustrated, as a result of the second refill layer 124 filling upper portions of the air spacers 120, the air spacers 120 may extend at somewhat different dimensions along the first spacer layer 80 adjacent to the replacement gates 112 as well as under and between source/drain regions 96. As illustrated in FIGS. 24C-24E, portions of the air spacers 120 at various depths $D_1'$, $D_2'$, and $D_3'$ may be measured from a bottom surface of the second refill layer 124, while portions of the air spacers 120 at depths $D_4$ and $D_5$ may be unaffected by the second refill layer 124. In addition, the thicknesses $T_1$, $T_2$, and $T_3$ may be unaffected by the second refill layer 124. For example, depth $D_1'$ may be between about 5 nm and about 30 nm, depth $D_2'$ may be between about 10 nm and about 40 nm, and depth $D_3'$ may be between about 40 nm and about 80 nm.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a method of forming a semiconductor device includes forming a dummy gate stack over a substrate; forming a first spacer layer over the dummy gate stack; oxidizing a surface of the first spacer layer to form a sacrificial liner; forming one or more second spacer layers over the sacrificial liner; forming a third spacer layer over the one or more second spacer layers; forming an inter-layer dielectric (ILD) layer over the third spacer layer; etching at least a portion of the one or more second spacer layers to form an air gap, the air gap being interposed between the third spacer layer and the first spacer layer; and forming a refill layer to fill an upper portion of the air gap. In an embodiment, etching includes etching at least a portion of the sacrificial liner. In an embodiment, each of the one or more second spacer layers and the sacrificial liner includes an oxide. In an embodiment, the method further includes, after forming the one or more second spacer layers, epitaxially growing source/drain region in the substrate adjacent the third spacer layer, wherein forming the third spacer layer includes forming the third spacer layer over the source/drain regions. In an embodiment, the air gap extends along a lower surface of the source/drain region. In an embodiment, the air gap extends along opposing sidewalls of the source/drain region. In an embodiment, the method further includes before the etching step, forming a capping layer over the ILD layer; and after the etching step, performing a planarization to remove the capping layer.

In another embodiment, a semiconductor structure includes a first fin protruding above an isolation region; a gate structure disposed over the first fin; a source/drain region over the first fin and adjacent the gate structure; an interlayer dielectric (ILD) disposed over the source/drain region; a first spacer along a sidewall of the gate structure, the first spacer being interposed between the ILD and the gate structure; and an air gap disposed over the first spacer, the air gap being laterally interposed between the ILD and the first spacer, the air gap being vertically interposed between the source/drain region and the isolation region. In an embodiment, the first spacer contacts an upper surface of the first fin, an upper surface of the isolation region, and the sidewall of the gate structure. In an embodiment, the structure further includes a second spacer, the second spacer contacting the upper surface of the isolation region and a bottom surface of the ILD. In an embodiment, the air gap contacts a lower surface of the source/drain region and a lower surface of the second spacer, wherein the second spacer contacts an upper surface of the source/drain region. In an embodiment, the structure further includes an insulating material directly interposed between the first spacer and the second spacer, wherein the air gap is bounded by the first spacer, the second spacer, the source/drain region, and the insulating material. In an embodiment, a portion of the air gap is directly interposed between the first spacer and the source/drain region.

In yet another embodiment, a semiconductor structure includes a shallow trench isolation (STI) region interposed between a first fin and a second fin; a first gate structure disposed over the STI region, the first fin, and the second fin; a second gate structure disposed over the STI region, the first fin, and the second fin; a source/drain region disposed over the first fin and the second fin, the source/drain region being interposed between the first gate structure and the second gate structure; a first spacer along a sidewall of the first gate structure, a sidewall of the second gate structure, and an upper surface of the STI region; a second spacer along an upper surface of the source/drain region; and an air gap interposed between the first spacer and the second spacer, the air gap exposing a lower surface of the second spacer and a lower surface of the source/drain region. In an embodiment, the air gap extends between the source/drain region and the first gate structure. In an embodiment, the air gap extends between the source/drain region and the second gate structure. In an embodiment, the first spacer separates the air gap from the STI. In an embodiment, the air gap has a first width between the first spacer and the second spacer, wherein the air gap has a second width between the first spacer and the source/drain region, wherein the first width is less than the second width. In an embodiment, the structure further includes a refill material over the air gap and interposed between the first spacer and the second spacer, an upper surface of the refill material being level with an upper surface of the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a dummy gate stack over a substrate;
   forming a first spacer layer over the dummy gate stack;
   oxidizing a surface of the first spacer layer to form a sacrificial liner;
   forming one or more second spacer layers over the sacrificial liner;
   forming a third spacer layer over the one or more second spacer layers;
   forming an inter-layer dielectric (ILD) layer over the third spacer layer;
   forming a capping layer over the ILD layer;

etching at least a portion of the one or more second spacer layers to form an air gap, the air gap being interposed between the third spacer layer and the first spacer layer;

forming a refill layer to fill an upper portion of the air gap; and after etching at least a portion of the one or more second spacer layers, performing a planarization to remove the capping layer.

2. The method of claim 1, wherein etching comprises etching at least a portion of the sacrificial liner.

3. The method of claim 2, wherein each of the one or more second spacer layers and the sacrificial liner comprises an oxide.

4. The method of claim 1, wherein etching the one or more second spacer layers comprises etching an entirety of the one or more second spacer layers.

5. The method of claim 1 further comprising, after forming the one or more second spacer layers, epitaxially growing a source/drain region in the substrate adjacent the dummy gate stack, wherein forming the third spacer layer comprises forming the third spacer layer over the source/drain region.

6. The method of claim 5, wherein the air gap extends along a lower surface of the source/drain region.

7. The method of claim 5, wherein the air gap extends along opposing sidewalls of the source/drain region.

8. A semiconductor structure, comprising:
a first fin protruding above an isolation region;
a gate structure disposed over the first fin;
a source/drain region over the first fin and adjacent the gate structure;
an interlayer dielectric (ILD) disposed over the source/drain region;
a first spacer along a sidewall of the gate structure, the first spacer being interposed between the ILD and the gate structure; and
an air gap disposed over the first spacer, the air gap being laterally interposed between the ILD and the first spacer, the air gap being vertically interposed between a lower surface of the source/drain region and an upper surface of the isolation region, the lower surface of the source/drain region facing the upper surface of the isolation region.

9. The structure of claim 8, wherein the first spacer contacts an upper surface of the first fin, the upper surface of the isolation region, and the sidewall of the gate structure.

10. The structure of claim 9 further comprising a second spacer, the second spacer contacting the upper surface of the isolation region and a bottom surface of the ILD.

11. The structure of claim 10, wherein the air gap contacts the lower surface of the source/drain region and a lower surface of the second spacer, wherein the second spacer contacts an upper surface of the source/drain region.

12. The structure of claim 11 further comprising an insulating material directly interposed between the first spacer and the second spacer, wherein the air gap is bounded by the first spacer, the second spacer, the source/drain region, and the insulating material.

13. The structure of claim 8, wherein a portion of the air gap is directly interposed between the first spacer and the source/drain region.

14. The structure of claim 8, wherein the first spacer comprises a first portion disposed along the sidewall of the gate structure and a second portion disposed along an upper surface of the ILD, and wherein the air gap is disposed along the first portion and the second portion of the first spacer.

15. A semiconductor structure, comprising:
a shallow trench isolation (STI) region interposed between a first fin and a second fin;
a first gate structure disposed over the STI region, the first fin, and the second fin;
a second gate structure disposed over the STI region, the first fin, and the second fin;
a source/drain region disposed over the first fin and the second fin, the source/drain region being interposed between the first gate structure and the second gate structure;
a first spacer along a sidewall of the first gate structure, a sidewall of the second gate structure, and an upper surface of the STI region;
a second spacer along an upper surface of the source/drain region; and
an air gap interposed between the first spacer and the second spacer, the air gap exposing a lower surface of the second spacer and a lower surface of the source/drain region, the air gap extending between the source/drain region and the first gate structure, the air gap further extending between the source/drain region and the second gate structure.

16. The structure of claim 15, wherein the first spacer separates the air gap from the STI.

17. The structure of claim 15, wherein the air gap has a first lateral width between the first spacer and the second spacer, wherein the air gap has a second lateral width between the first spacer and the source/drain region, wherein the first lateral width is less than the second lateral width.

18. The structure of claim 15 further comprising a refill material over the air gap and interposed between the first spacer and the second spacer, an upper surface of the refill material being level with an upper surface of the first spacer.

19. The structure of claim 18, wherein top surfaces of the refill material, the first spacer, and the second spacer are level.

20. The structure of claim 18, wherein in a cross-section the air gap is fully bounded by the first spacer, the second spacer, the source/drain region, and the refill material.

* * * * *